United States Patent
Ben-Ayun et al.

(10) Patent No.: US 7,095,988 B2
(45) Date of Patent: Aug. 22, 2006

(54) APPARATUS FOR LINEAR TRANSMITTER WITH IMPROVED LOOP GAIN STABILIZATION

(75) Inventors: Moshe Ben-Ayun, Shoham (IL); Mark Rozental, Rehovot (IL)

(73) Assignee: Motorola, Inc., Schaumburg, IL (US)

( * ) Notice: Subject to any disclaimer, the term of this patent is extended or adjusted under 35 U.S.C. 154(b) by 244 days.

(21) Appl. No.: 10/220,323

(22) PCT Filed: Feb. 26, 2001

(86) PCT No.: PCT/IB01/00254

§ 371 (c)(1),
(2), (4) Date: Dec. 10, 2002

(87) PCT Pub. No.: WO01/63792

PCT Pub. Date: Aug. 30, 2001

(65) Prior Publication Data

US 2003/0119462 A1 Jun. 26, 2003

(30) Foreign Application Priority Data

Feb. 25, 2000 (GB) .................................. 0004557.5

(51) Int. Cl.
*H04B 1/04* (2006.01)
*H03G 3/20* (2006.01)
*H03F 1/26* (2006.01)

(52) U.S. Cl. ................. 455/126; 455/127.2; 455/114.3; 330/129; 330/149

(58) Field of Classification Search ................. 455/126, 455/127.2, 127.3, 127.4, 114.3, 114.4
See application file for complete search history.

(56) References Cited

U.S. PATENT DOCUMENTS

| 5,376,895 | A | * | 12/1994 | Aihara ........................ 330/129 |
| 5,420,536 | A | * | 5/1995 | Faulkner et al. ............. 330/149 |
| 5,423,082 | A | * | 6/1995 | Cygan et al. ................ 455/126 |
| 5,469,105 | A | * | 11/1995 | Sparks ........................ 330/129 |
| 5,507,017 | A | * | 4/1996 | Whitmarsh et al. .......... 455/126 |
| 5,542,096 | A | * | 7/1996 | Cygan et al. ............. 455/115.2 |
| 5,564,087 | A | * | 10/1996 | Cygan et al. ................ 455/126 |
| 5,673,001 | A | * | 9/1997 | Kim et al. ................... 330/284 |
| 5,675,286 | A | * | 10/1997 | Baker et al. ................. 330/129 |
| 5,752,171 | A | * | 5/1998 | Akiya ........................ 455/126 |
| 5,901,346 | A | * | 5/1999 | Stengel et al. .............. 455/126 |
| 5,933,767 | A | * | 8/1999 | Leizerovich et al. ......... 455/126 |
| 6,044,253 | A | * | 3/2000 | Tsumura ................... 455/234.1 |
| 6,252,456 | B1 | * | 6/2001 | Baker et al. ............. 330/207 P |
| 6,384,677 | B1 | * | 5/2002 | Yamamoto .................... 330/10 |
| 6,438,360 | B1 | * | 8/2002 | Alberth et al. .............. 455/110 |
| 6,606,483 | B1 | * | 8/2003 | Baker et al. ................. 455/126 |
| 6,731,694 | B1 | * | 5/2004 | Bozeki et al. ............... 375/297 |

* cited by examiner

*Primary Examiner*—Duc M. Nguyen
(74) *Attorney, Agent, or Firm*—Terri S. Hughes; Valerie M. Davis

(57) ABSTRACT

A device for linear transmitter (150) with improved loop gain stabilization. The linear transmitter (150) includes a main amplifier loop (178) and an auxiliary loop (176). The device includes an adjustable device (159), connected within the main amplifier feedback loop (178) and further connected to the auxiliary loop (176). The adjustable driver (159) receives an input signal from main amplifier feedback loop (178), amplifies it in accordance with a gain control signal received from the auxiliary loop (176) and provides the amplified signal to main amplifier feedback loop (178).

8 Claims, 2 Drawing Sheets

250
APPARATUS FOR LINEAR TRANSMITTER WITH IMPROVED LOOP GAIN STABILIZATION

FIELD OF THE INVENTION

The present invention relates to radio frequency transmitters in general, and to linear radio frequency transmitters having a varying antenna load, in particular.

BACKGROUND OF THE INVENTION

Radio communication devices use antennas to provide efficient transmission of radio frequency communication signals. The transmission portion of a communication device includes a power amplifier for amplifying the radio frequency signals before they are coupled to the antenna for transmission. The power amplifier design often relies on constant load impedance which is directed at maximizing gain, efficiency, power output level, and the like. The behavior of a transmitter may be affected by its operating environment. For example, a transmitter operating near an electromagnetically reflective structure may be susceptible to energy reflected back through the antenna into the transmitter. Reflective energy may be detrimental to transmitter performance, particularly to the performance of the power amplifier. An isolator or circulator is often inserted between the antenna and the power amplifier to protect against changes in load impedance as a result of reflected energy.

The isolator protects the power amplifier by absorbing the reflected energy and preventing it from reaching the amplifier. The isolator directs the reflected energy to an absorptive load termination. An isolator typically adds significant cost, size and weight to the design of a radio communication device.

U.S. Pat. No. 5,564,087 to Cygan et al., entitled "Method and apparatus for a linear transmitter" discloses another solution to the problem of reflected energy. The solution incorporates a directional coupler to detect the reflected energy and provides a means of adjusting the gain of the power amplifier accordingly. Generally, the gain to the power amplifier is reduced when high levels of reflected energy are present. In this approach, the circuitry for detection of the reflected energy must operate at the transmission frequency. This adds significant cost and complexity to the radio design.

U.S. Pat. No. 5,675,286 to Baker et al., entitled "Method and apparatus for an improved linear transmission", is directed to a method and apparatus for isolator elimination, operative at the baseband frequencies, which is described in detail, herein below. Reference is made to FIG. 1, which is a schematic illustration of a linear transmitter block of a radio communication device, generally referenced 50, which is known in the art. Transmitter block 50 includes an attenuator 52, three summators 54, 66 and 70, a baseband loop filter unit 56, an up-mixer and radio-frequency (RF) filter unit 58, an RF power amplifier 60, a down-mixer and baseband filter unit 64, a phase shifter unit 62, an AGC 68, an adaptor unit 72 and an antenna 74. Summator 54 is connected to attenuator 52, to baseband filter unit 56 and to phase shifter unit 62. Summator 66 is connected to baseband filter unit 56, to up-mixer and RF filter unit 58, to adaptor unit 72 and to AGC 68. Summator 70 is connected to AGC 68, to attenuator 52 and to adaptor unit 72. Adaptor 72 is further connected to AGC 68, to attenuator 52 and to phase shifter unit 62. Up-mixer and RF filter unit 58 is connected to baseband loop filter unit 56 and to power amplifier 60.

Down-mixer and baseband filter unit 64 is further connected to power amplifier 60 and to phase shifter unit 62. Antenna 74 is connected to power amplifier 60 and to down-mixer and baseband filter unit 64.

A signal 80 is provided as input to amplifier feedback loop 78 and to isolator elimination circuit 76. Amplifier feedback loop 78 and isolator elimination circuit 76 represent the main amplification lop and the auxiliary loop, respectively. Amplifier feedback loop 78 is a closed loop amplifier structure. Typically, this structure can be considered a Cartesian feedback loop amplifier. The input signal 80 is generally a complex digital baseband signal, having quadrature components, i.e. in-phase (I) component and quadrature (Q) component. Signal 80 is provided to attenuator 52. Attenuator 52 provides an attenuated signal to summator 54. Summator 54 combines this signal with a feedback loop output signal 82 and provides a resulting error signal to baseband filter unit 56. Baseband filter unit 56 provides the filtered error signal to up-mixer and RF filter unit 58. Up-mixer and RF filter unit 58 up-converts the signal to RF and provides it to power amplifier 60. Power amplifier 60 amplifies the signal and provides the amplified signal to antenna 74 for transmission. Antenna 74 forms a load for power amplifier 60. It is noted that this load is susceptible to impedance variations due to its operating environment. Power amplifier 60 provides a portion of the output signal to summator 54, via down-mixer and baseband circuit 64 and phase shifter unit 62, thereby generating feedback loop output signal 82. Feedback loop output signal 82 constitutes a feedback signal for controlling the gain of power amplifier 60 and maintaining transmitter block 50 in the linear mode of operation.

Baseband filter unit 56 also provides a filtered error signal 90 to summator 66. Summator 66 combines error signal 90 with signal 84 from adaptor 72 and provides the result to AGC 68. AGC 68 constitutes a linear gain control circuit of isolator elimination circuit 76. Adaptor 72 controls the gain of AGC 68 by altering the output signal of AGC 68. AGC 68 provides the output signal to summator 70, where it is combined with input signal 80. Summator 70 provides the resulting error signal 94 to adaptor 72, which produces two output control signals 86 and 88. Control signal 86 adjusts the gain of attenuator 52, and control signal 88 adjusts phase shifter 62. Adaptor 72 produces control signals 84, 86 and 88 based on input signal 80 and error signal 94.

To avoid the undesirable effects, it is necessary to design a transmitter with sufficient gain and/or power reserve. Such a design will result in increased complexity, cost, power consumption and more. There is a trade-off between the desired design simplicity and cost-effectiveness on one hand, and necessary dynamic range of system gain and/or output power, on the other hand. It is desirable to provide a linear transmitter, which is cost-effective and simple, yet assuring linear performance and high signal-to-noise ratio.

SUMMARY OF THE PRESENT INVENTION

It is an object of the present invention to provide a novel method and device for a linear transmitter with improved loop gain stabilization, which alleviates the disadvantages of the prior art.

In accordance with the present invention in a first aspect, there is thus provided a device for minimizing performance degradation of a linear transmitter block of a radio communication device in the presence of antenna interference, the linear transmitter block including a main amplifier feedback loop and an auxiliary loop, and an upconverter for converting baseband signals into radio frequency signals, the device comprising an amplifier having an adjustable driver arranged to receive from said upconverter an input signal which includes a component from said main amplifier feedback loop and to receive a gain control signal from said auxiliary loop, said amplifier being operable to amplify said received input signal according to said gain control signal and to provide an amplified output signal a portion of which is provided in operation to said main amplifier feedback loop.

The said upconverter may have an input connection via which a baseband input signal is in operation applied, the main amplifier feedback loop being connected to the input connection. The input connection to the upconverter may include a baseband filter and the main amplifier feedback loop may be connected to the input connection so that a component of a signal applied to the baseband filter is in operation from the main amplifier feedback loop.

The said main amplifier loop may include a down-mixer, a baseband filter and a phase shifter.

The said auxiliary loop may include an an AGC (automatic gain control) circuit arranged to receive in operation an portion of a signal which is applied as an input signal to the upconverter and to apply an output signal to the adjustable driver, the auxiliary loop also including an adaptor arranged to control gain of the AGC circuit.

The main amplifier feedback loop may be operable to process a portion of an output signal of the amplifier by down-converting by said down-mixer and baseband filter unit and phase shifting by said phase shifter. The phase shifter may be arranged to be controlled by a control signal from said adaptor.

An attenuator may be arranged to provide an output signal which is combined with an input baseband signal to provide an input to a baseband filter which in turn is arranged to provide an output signal to the upconverter. The attenuator may be connected to receive in operation an input signal component from the adaptor, an output signal of the attenuator being combined in operation prior to application to the baseband filter with an output signal of said main amplifier feedback loop.

According to the present invention in a second aspect there is provided a linear transmitter bolck including a device according to the first aspect.

Embodiments of the present invention will now described by way of example with reference to the accompanying drawings, in which:

DETAILED DESCRIPTION OF PREFERRED EMBODIMENTS

The present invention overcomes the disadvantages of the prior art by providing an adjustable driver for improving loop gain stabilization.

Figure 1:
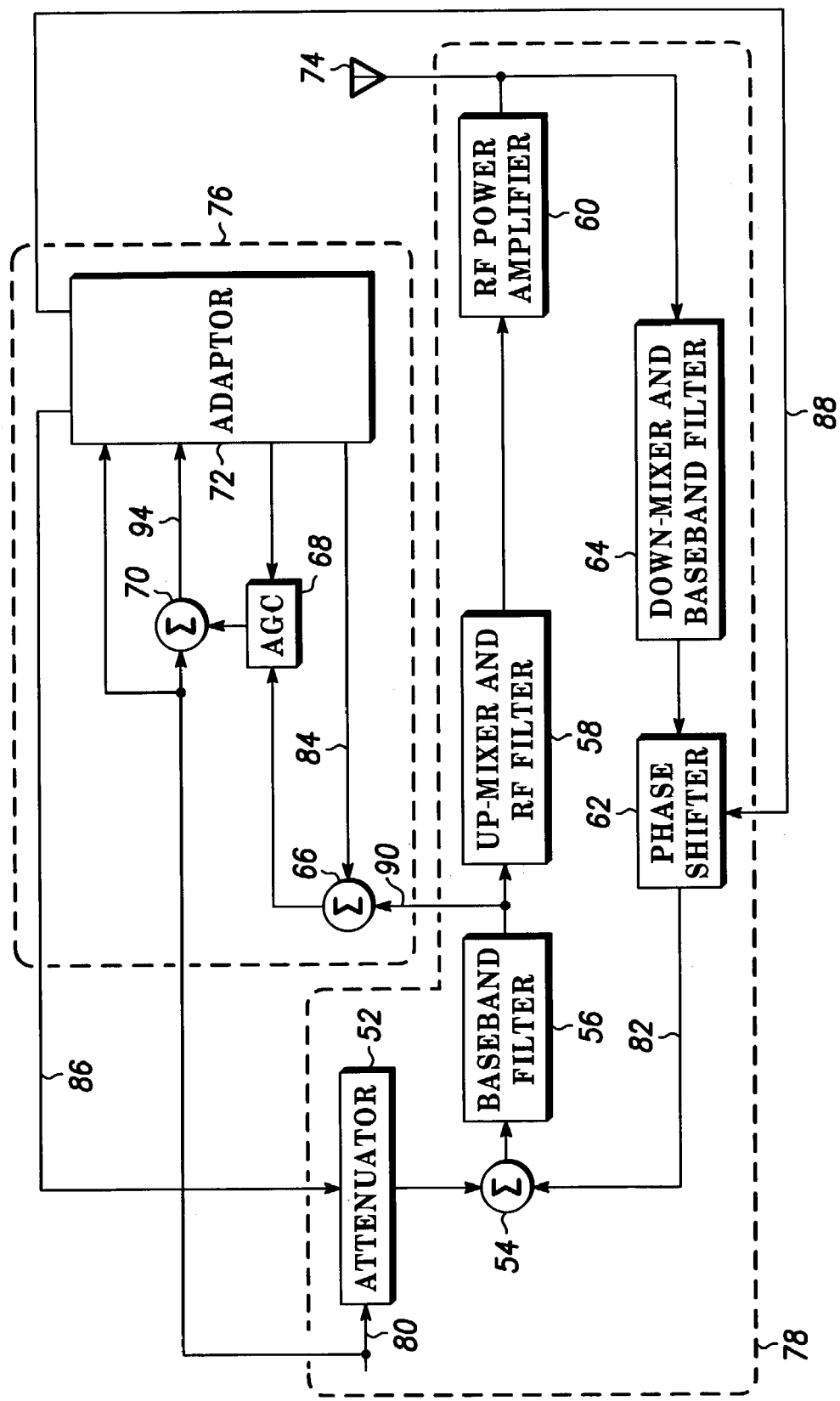
FIG. 1 is a block schematic circuit diagram of a linear transmitter block of a radio communication device, which is known in the art.
Figure 2:
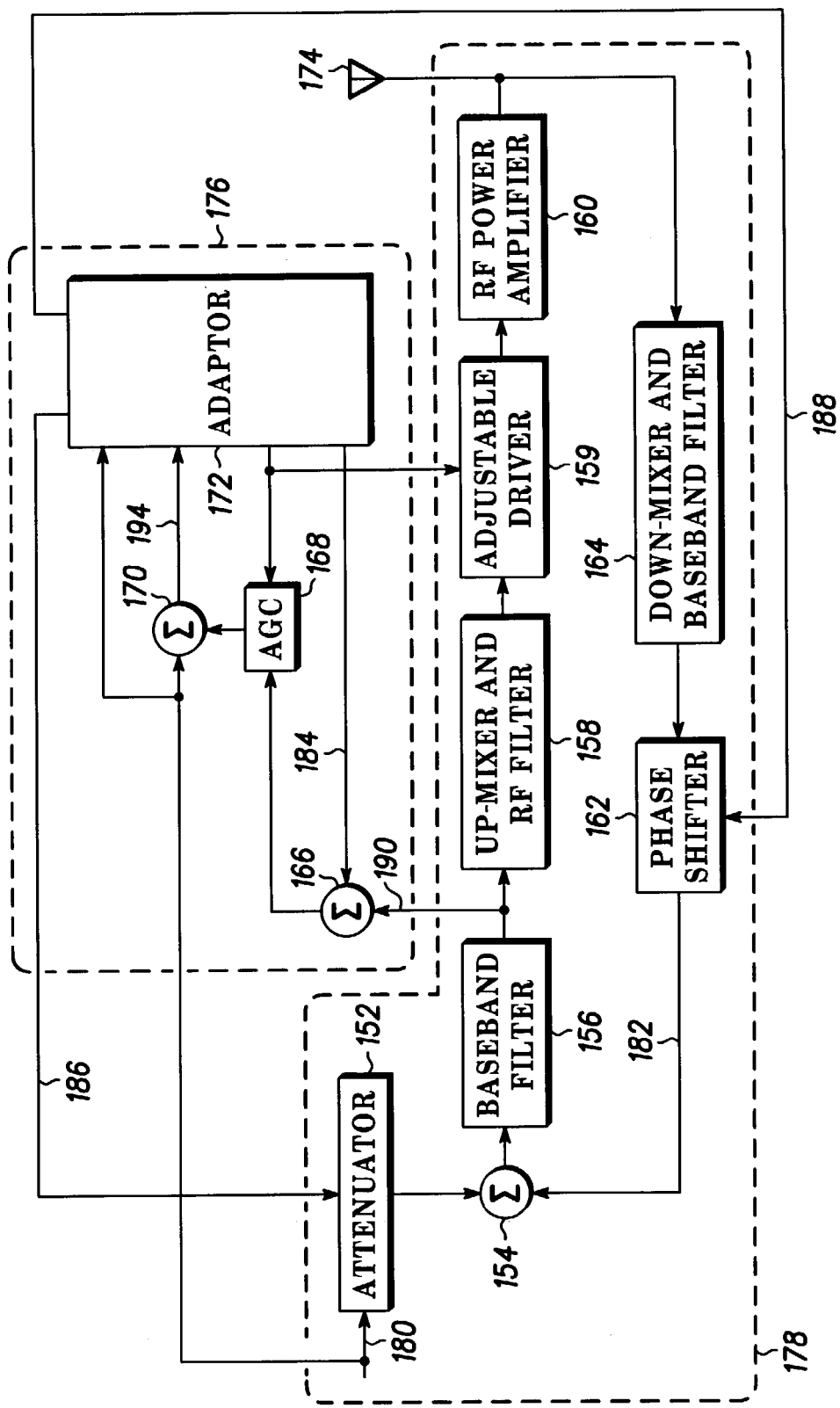
FIG. 2 is a block schematic circuit diagram of a linear transmitter block of a radio communication device, constructed and operable in accordance with a preferred embodiment of the present invention.

Reference is now made to FIG. 2, which is a schematic illustration of a linear transmitter block of a radio communication device, generally referenced 150, constructed and operative in accordance with a preferred embodiment of the present invention. Transmitter block 150 includes an attenuator 152, three summators 154, 166 and 170, a baseband loop filter unit 156, an up-mixer and radio-frequency (RF) filter unit 158, an adjustable driver unit 159, a RF power amplifier 160, a down-mixer and baseband filter unit 164, a phase shifter unit 162, an AGC 168, an adaptor unit 172 and an antenna 174. Summator 154 is connected to attenuator 152, to baseband filter unit 156 and to phase shifter unit 162. Summator 166 is connected to baseband filter unit 156, to up-mixer and RF filter unit 158, to adaptor 172 and to AGC 168. Summator 170 is connected to AGC 168, to attenuator 152 and to adaptor unit 172. Adaptor 172 is further connected to AGC 168, to adjustable driver 159, to attenuator 152 and to phase shifter unit 162. Up-mixer and RF filter unit 158 is connected to baseband loop filter unit 156 and to adjustable driver 159. Power amplifier 160 is connected to adjustable driver 159 and to antenna 174. Down-mixer and baseband filter unit 164 is connected to power amplifier 160 and to phase shifter unit 162. Antenna 174 is connected to power amplifier 160 and to down-mixer and baseband filter unit 164.

A signal 180 is the input signal to an amplifier feedback loop 178 and an isolator elimination circuit 176. Amplifier feedback loop 178 and isolator elimination circuit 176 represents the main amplification loop and the auxiliary loop, respectively. Amplifier feedback loop 178 is a closed loop amplifier structure. Typically, this structure can be considered a Cartesian feedback loop amplifier. The input signal 180 is generally a complex digital baseband signal having quadrature components, i.e. in-phase (I) component and quadrature (Q) component. Signal 180 is provided to attenuator 152. Attenuator 152 provides an attenuated signal to summator 154. Summator 154 combines this signal with a feedback loop output signal 182 and provides a resulting error signal to baseband filter unit 156. Baseband filter unit 156 provides the filtered error signal to up-mixer and RF filter unit 158. Up-mixer and RF filter unit 158 up-converts the signal to RF and provides it to adjustable driver 159. Adaptor 172 controls the gain of adjustable driver 159. Adjustable driver 159 provides the output signal to power amplifier 160. Power amplifier 160 amplifies the signal and provides the amplified signal to antenna 174 for transmission. Antenna 174 forms a load for power amplifier 160. It is noted that this load is susceptible to impedance variations due to its operating environment. Power amplifier 160 provides a portion of the output signal to summator 154, via down-mixer and baseband unit 164 and phase shifter unit 162, thereby generating feedback loop output signal 182. Feedback loop output signal 182 constitutes a feedback signal for controlling the gain of power amplifier 160 and maintaining transmitter block 150 in the linear mode of operation.

Baseband filter unit 156 also provides a filtered error signal 190 to summator 166. Summator 166 combines error signal 190 with signal 184 from adaptor 172 and provides the result to AGC 168. AGC 168 constitutes a linear gain control circuit of isolator elimination circuit 176. Adaptor 172 controls the gain of AGC 168 by altering the output signal of AGC 168. Adaptor 172 controls also the gain of adjustable driver 159. AGC 168 provides the output signal to summator 170, where it is combined with input signal 180. Summator 170 provides the resulting error signal 194 to adaptor 172, which produces two output control signals 186 and 188. Control signals 186 adjusts the gain of attenuator 152, and control signal 188 adjusts phase shifter 162.

Adaptor 172 produces control signals 184, 186 and 188 based on input signal 180 and error signal 194.

In comparing the linear transmitter 150 of the present invention with that of the prior art, it is significant to note the presence of adjustable driver 159. Its gain, which is dynamically controlled by adaptor 172, depends on information contained in error signals 190 and 194. Since adjustable driver 159 adds additional gain to feedback loop 178, it is possible to use low-power isolator elimination circuitry, yet maintaining required loop gain and linearity of the system 150.

The invention claimed is:

1. A device for minimizing performance degradation of a linear transmitter block of a radio communication device in the presence of antenna interference, the linear transmitter block including a main amplifier closed feedback loop to control gain and linearity of a radio frequency (RF) power amplifier and an auxiliary loop comprising an isolator eliminator to compensate at baseband for antenna load variations on the RF power amplifier, and an upconverter for converting baseband signals into radio frequency signals, the device comprising the RF power amplifier having an adjustable driver arranged to receive from said upconverter an input signal which includes a component from said main amplifier feedback loop and to receive a gain control signal from said auxiliary loop, the adjustable driver being coupled between the upconverter and the amplifier for causing said amplifier to be operable to amplify said received input signal according to said gain control signal and to provide an amplified output signal a portion of which is provided in operation to said main amplifier feedback loop for generating the component included in the input signal from the upconverter.

2. A device according to claim 1, wherein the upconverter has an input connection via which a baseband input signal is in operation applied and the main amplifier feedback loop is connected to the input connection.

3. A device according to claim 2, wherein the input connection to the upconverter includes a baseband filter and the main amplifier feedback loop is connected to the input connection so that a component of a signal applied to the baseband filter is in operation from the main amplifier feedback loop.

4. A device according to claim 1, wherein said main amplifier loop includes a down-mixer and baseband filter and a phase shifter.

5. A device according to claim 1, wherein said auxiliary loop includes an an AGC (automatic gain control) circuit arranged to receive in operation an portion of a signal which is applied as an input signal to the upconverter and to apply an output signal to the adjustable driver, the auxiliary loop also including an adaptor arranged to control gain of the AGC circuit.

6. A device according to claim 5, wherein said main amplifier loop includes a down-mixer and baseband filter and a phase shifter, wherein the main amplifier feedback loop is operable to process a portion of an output signal of the amplifier by down-converting by said down-mixer and baseband filter unit and phase shifting by said phase shifter, wherein said phase shifter is arranged to be controlled by a control signal from said adaptor.

7. A device according to claim 5, wherein said main amplifier loop includes a down-mixer and a baseband filter and a phase shifter and the device includes an attenuator arranged to provide an output signal which is combined with an input baseband signal to provide an input to the baseband filter which in turn is arranged to provide an output signal to the upconverter, the attenuator being connected to receive in operation an input signal component from the adaptor, an output of the attenuator being combined in operation prior to application to the baseband filter with an output signal of said main amplifier feedback loop.

8. A linear transmitter block of a radio communication device, said linear transmitter block comprising a main amplifier closed feedback loop to control gain and linearity of a radio frequency (RF) power amplifier and an auxiliary loop comprising an isolator eliminator to compensate at baseband for antenna load variations on the RF power amplifier, an upconverter for converting baseband signals into radio frequency signals, and a device for minimizing performance degradation of the linear transmitter block in the presence of antenna interference, said device for minimizing performance degradation comprising the RF power amplifier having an adjustable driver arranged to receive from said upconverter an input signal which includes a component from said main amplifier feedback loop and to receive a gain control signal from said auxiliary loop, said amplifier being operable to amplify said received input signal according to said gain control signal and to provide an amplified output signal a portion of which is provided in operation to said main amplifier feedback loop for generating the component included in the input signal from the upconverter.

* * * * *

UNITED STATES PATENT AND TRADEMARK OFFICE
CERTIFICATE OF CORRECTION

PATENT NO. : 7,095,988 B2 Page 1 of 1
APPLICATION NO. : 10/220323
DATED : August 22, 2006
INVENTOR(S) : Ben-Ayun et al.

It is certified that error appears in the above-identified patent and that said Letters Patent is hereby corrected as shown below:

Line 47, column 5, delete "an"

Line 1, column 6, change "an" to --a--

Signed and Sealed this

Sixth Day of March, 2007

JON W. DUDAS
*Director of the United States Patent and Trademark Office*